United States Patent
Feinn et al.

(10) Patent No.: US 7,669,314 B2
(45) Date of Patent: Mar. 2, 2010

(54) METHOD OF FABRICATING A FLUID EJECTION DEVICE HAVING A DATA STORAGE STRUCTURE

(75) Inventors: James A Feinn, San Diego, CA (US); Lawrence White, Corvallis, OR (US); Satya Prakash, Poway, CA (US); Donald W Schulte, Corvallis, OR (US); Terry Mcmahon, Corvallis, OR (US); Adam Ghozeil, Corvallis, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 223 days.

(21) Appl. No.: 11/770,964

(22) Filed: Jun. 29, 2007

(65) Prior Publication Data

US 2007/0245559 A1    Oct. 25, 2007

Related U.S. Application Data

(62) Division of application No. 10/434,759, filed on May 9, 2003, now Pat. No. 7,249,825.

(51) Int. Cl.
*H05B 3/00* (2006.01)

(52) U.S. Cl. ............... 29/611; 29/610.1; 29/613; 29/829; 29/890.1; 347/19; 347/49; 347/62

(58) Field of Classification Search .......... 29/611, 29/610.1, 613, 620, 825, 829, 890.1; 347/14, 347/19, 49, 62
See application file for complete search history.

(56) References Cited

U.S. PATENT DOCUMENTS

| | | | | | |
|---|---|---|---|---|---|
| 4,872,027 | A | * | 10/1989 | Buskirk et al. | 347/19 |
| 5,610,635 | A | * | 3/1997 | Murray et al. | 347/7 |
| 6,318,828 | B1 | * | 11/2001 | Barbour et al. | 347/9 |
| 6,336,713 | B1 | * | 1/2002 | Regan et al. | 347/62 |

* cited by examiner

*Primary Examiner*—Thiem Phan

(57) ABSTRACT

Methods for fabricating a printhead are described. In one embodiment, a method includes forming on a substrate using a single fabrication technique multiple resistors, some of the resistors to be used as heater resistors configured to eject fluid and some of the resistors to be used as storage resistors that store data, annealing the heater resistors, and intentionally not annealing at least one of the storage resistors, wherein the annealed storage resistors have a first state representing a first digital value and the unannealed storage resistors have a second state representing a second digital value, such that the values associated with the storage resistors can be read by an appropriate detection circuit.

9 Claims, 6 Drawing Sheets

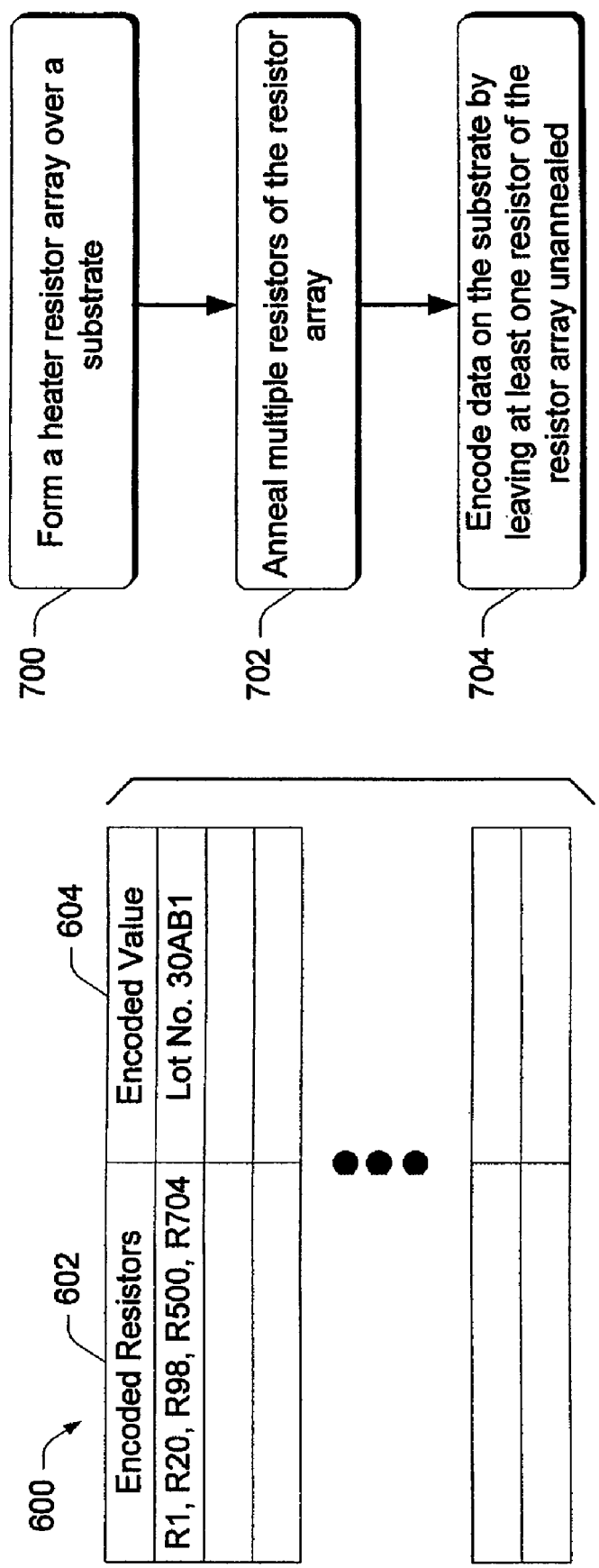

METHOD OF FABRICATING A FLUID EJECTION DEVICE HAVING A DATA STORAGE STRUCTURE

CROSS-REFERENCE TO RELATED APPLICATION

This application is a divisional of copending U.S. utility application entitled, "Fluid Ejection Device With Data Storage Structure," having Ser. No. 10/434,759, filed May 9, 2003, which is entirely incorporated herein by reference.

TECHNICAL FIELD

This invention relates to fluid ejection device methods and systems.

BACKGROUND

One type of fluid ejection device is an ink jet printer. The art of ink jet printing is relatively well developed. Commercial products such as computer printers, graphics plotters, and facsimile machines have been implemented with ink jet technology for producing printed media.

Generally, an ink jet image is formed pursuant to precise placement on a print medium of ink drops emitted by an ink drop generating device known as an ink jet printhead. Typically, an ink jet printhead is supported on a movable print carriage that traverses over the surface of the print medium and is controlled to eject drops of ink at appropriate times pursuant to command of a microcomputer or other controller, wherein the timing of the application of the ink drops is intended to correspond to a pattern of pixels of the image being printed.

One embodiment of a Hewlett-Packard ink jet printhead includes an array of precisely formed nozzles in an orifice plate that is attached to an ink barrier layer which in turn is attached to a thin film substructure that implements ink firing heater resistors and apparatus for enabling the resistors. The ink barrier layer defines ink channels including ink chambers disposed over associated ink firing resistors, and the nozzles in the orifice plate are aligned with associated ink chambers. Ink drop generator regions are formed by the ink chambers and portions of the thin film substructure and the orifice plate that are adjacent the ink chambers.

The thin film substructure is typically comprised of a substrate such as silicon on which are formed various thin film layers that form thin film ink firing resistors, apparatus for enabling the resistors, and also interconnections to bonding pads that are provided for external electrical connections to the printhead. The ink barrier layer is typically a polymer material that is laminated as a dry film to the thin film substructure, and is designed to be photodefinable and both UV and thermally curable. In an ink jet printhead of a slot feed design, ink is fed from one or more ink reservoirs to the various ink chambers through one or more ink feed slots formed in the substrate. Examples of ink jet printheads are set forth in commonly assigned U.S. Pat. Nos. 4,719,477 and 5,317,346. In another embodiment, the barrier layer and orifice plate are integral.

During and after the manufacture of ink jet printheads, it is desirable to develop and store data associated with the printhead. Such data can include the wafer lot, wafer number, color, and other information. This data can be stored using an off chip or off die EEPROM. Alternately, the data can be stored on the die itself.

In the past, storing data on the die itself has involved the use of separate fusible links or fuses. The fuses have typically been fabricated as TaAl resistors. One of the issues associated with using on-die fuses stems from the fact that in order to program the fuse, it is electrically blown to define an open circuit. Blowing a fuse on the die, however, can do a significant amount of thermal damage to the surrounding thin film structure. Specifically, blowing an on-die fuse entails breaking overlying passivation layers, melting structure underneath the layers, and the like. Normally, this would not be an issue for substrates that are used in a hermetically-sealed, dry environment. With the ink jet product, however, due to the nature of the fluidic environment in which it operates, even in view of the various barrier materials that can be used to isolate the fuses, there still is a very real possibility for failure to occur due to ink leaking into the fuse area. This is an undesirable situation because not only can stored data be lost, but there is a chance that the overall functionality of the die itself can be compromised.

SUMMARY

A fluid ejection device having storage and methods of forming and using such fluid ejection devices are described. In one embodiment, a substrate comprises multiple heater resistors supported thereby, and configured for ejecting fluid onto a medium. One storage structure is supported by the substrate and configured to store data.

BRIEF DESCRIPTION OF THE DRAWINGS

FIG. 6 is a table that can be utilized in accordance with one or more embodiments.

FIG. 7 is a flow diagram that describes steps in a method in accordance with one embodiment.

DETAILED DESCRIPTION

Overview

Various embodiments provide methods and resultant structures that employ on-die, non-volatile, non-fusable storage structures on ink jet printhead die. Because resistor material is used to store data in a manner which does not require it to be subjected to fuse-blowing processes, most if not all of the issues associated with the fusing-blowing processes are mitigated.

Using Resistor Material as a Non-Fusible Storage Structure

In accordance with one embodiment, on-die resistor material is used as a non-fusible storage structure. Using on-die resistor material for non-fusible storage material employs the resistor material to provide PROM-like storage capabilities. Because the resistor material is used to store data in a manner which does not require it to be subjected to fuse-blowing processes, most if not all of the issues associated with the fusing-blowing processes are mitigated. Specifically, the resultant thermal damage to surrounding thin film substrate material is substantially avoided. Accordingly, the risk of failure due to fluidic compromise is also reduced.

In selecting a resistor material for use as a non-fusible storage structure, various described embodiments can make use of a material that has the following characteristic. The material has a first resistance value before it is annealed and a second different resistance value after it is annealed. By selecting a material that has a resistance value that is a function of whether or not it has been annealed, individual storage structures can be formed on the die substrate. In one state (e.g. the unannealed state), the storage structure can represent a first digital value such as a 1 or 0. In the other state (e.g. the annealed state), the storage structure can represent a second digital value—the compliment of the first digital value.

Additionally, in one embodiment the storage structures can be formed contemporaneously with and using the at least some of the same process flow that is utilized to form the regular heater resistors that are employed in the print head.

Figure 1:
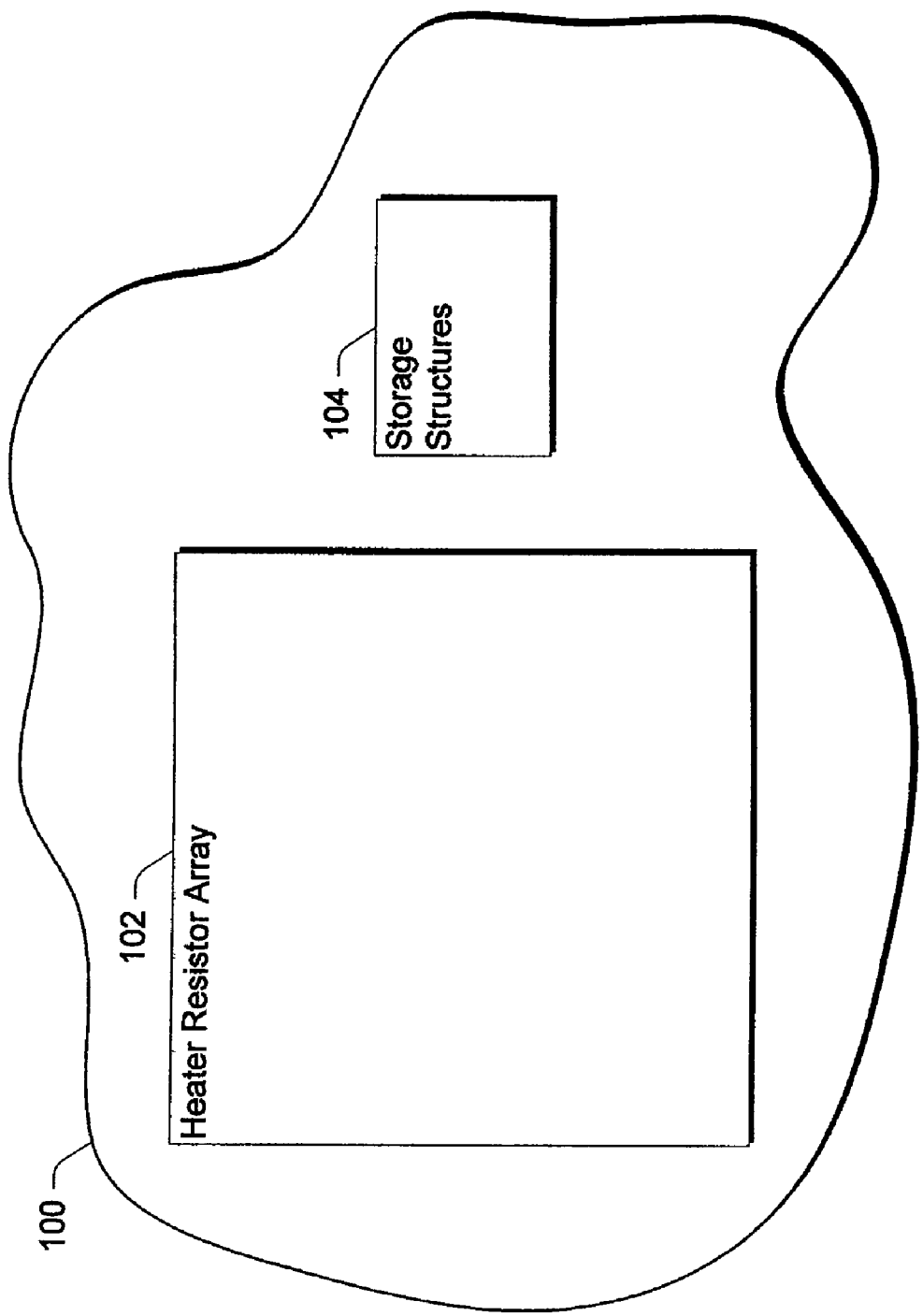
FIG. 1 is a diagram that illustrates an ink jet printhead substrate having a heater resistor array and storage structures in accordance with one embodiment.

As an example, consider FIG. 1. There in accordance with one embodiment, a substrate 100 is provided and comprises a heater resistor array 102 that includes the heater resistors that are employed to eject ink in the printhead. Additionally, storage structures 104 are provided on the substrate and are formed using the same techniques that are utilized to form the heater resistor array. In the illustrated example, both the heater resistor array and the storage structures are formed such that they are electrically addressable. The techniques that can be utilized to form the heater resistor array and storage structure can comprise any suitable techniques. For examples of ink jet printing systems that include addressable heater resistor arrays and formation techniques, the reader is referred to the following U.S. Pat. Nos. 6,305,774; 6,412,917; 6,318,828; and 5,677,577, all of which are assigned to the assignee of this document.

As but one process flow that can be utilized to form resistor arrays and storage structures, consider the following. The resistor material can first be deposited and a metal such as aluminum can be deposited on top of the resistor material. The metal is then patterned into traces and a photo mask is applied and used to selectively remove aluminum off of the top of resistor material to form high resistance heater resistors. A nitride/carbide passivation layer is formed over the metal and vias are patterned and etched therein. Tantalum and gold can then be deposited. Subsequently the gold and the tantalum are patterned and etched to provide a resultant resistor array and associated storage structures.

As noted above, any suitable material having the characteristic that annealing changes its resistance value can be used. One exemplary material comprises WSiN. Various WSiN alloys, stoichiometries and processing techniques that can be utilized to form ink jet heater resistors are described in U.S. Pat. No. 6,336,713, assigned to the assignee of this document. Accordingly, for the sake of brevity, such techniques will be known by those of skill in the art and are not described here in additional detail.

Other materials can include the general class of Cermet resistor materials examples of which are metal-silicon oxides (Cr—SiO, W—SiO, Ta—SiO), and metal-silicon nitrides such as WSiN, TaSiN, and the like.

WSiN has been found to have a change in resistance when it is heated or annealed at a high temperature. Experiments with this material have shown that a resistance decrease from between about 7%-12% occurs when the resistors are first heated or annealed. This shift occurs fairly rapidly and stabilizes at the lower resistance value, where it remains for the remainder of the resistor's life. The rapidity with which this resistance change occurs and the amount of change can be varied by changing the input voltage across the resistor, and thereby the temperature. The method by which the resistors are annealed and the overall degree to which they are annealed is determined by proper selection of the pulse width, energy or maximum power per pulse, frequency of the pulses, and total number of pulses applied to the resistor during the annealing process. In one example, a string of 2000 2.5 micro-sec wide pulses was applied at 20 kHz, with a power between about 0.0015-0.002 Watts per square micron of resistor area for a material that is 60:40 mol percent $W:Si_3N_4$.

Figure 2:
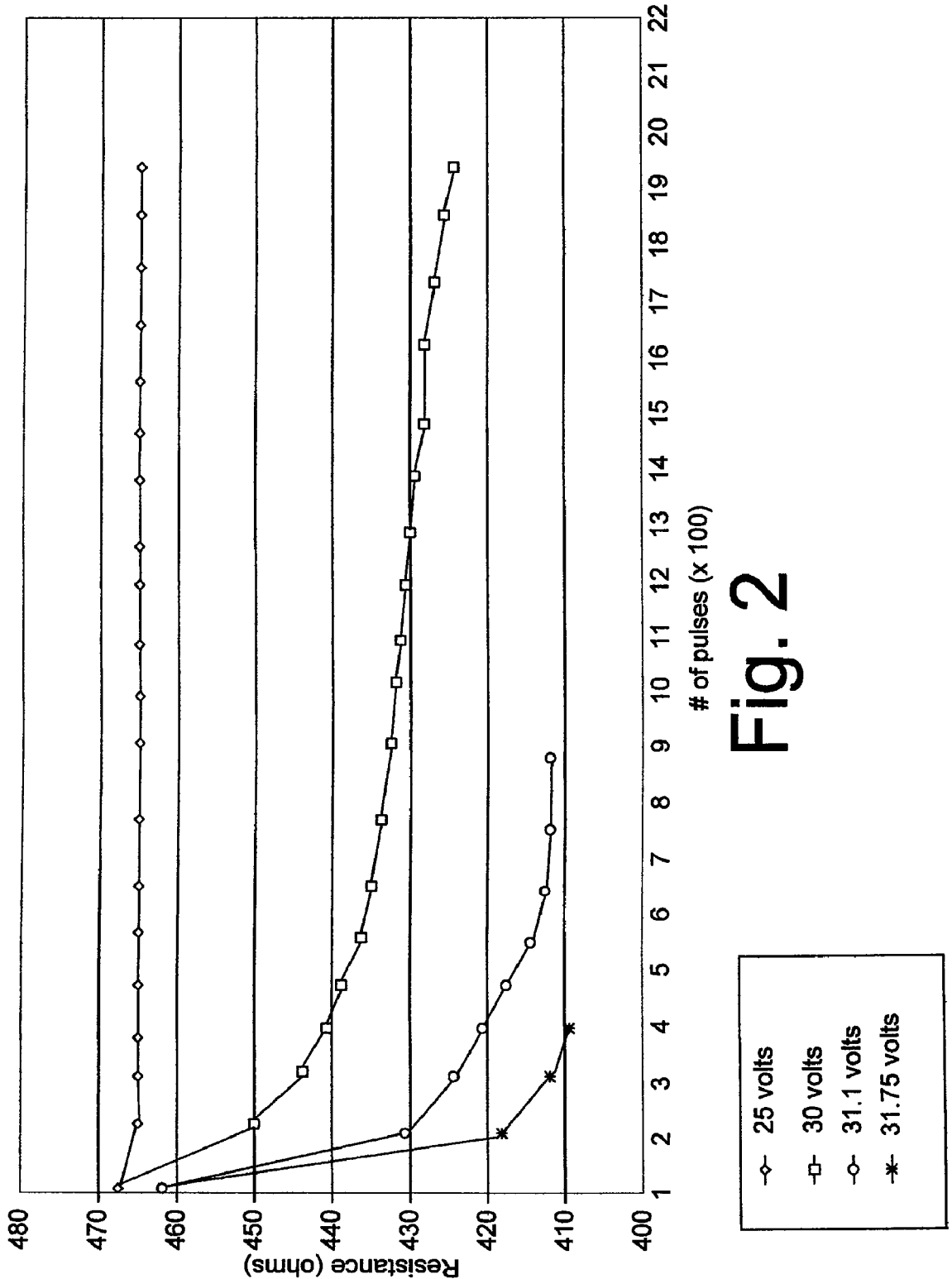
FIG. 2 is a graph that describes characteristics of annealed versus unannealed resistor material in accordance with one embodiment.

As an example, consider FIG. 2 which is a graph that shows the behavior of a 30×30 micron WSiN resistor in which a decrease of resistance occurs as a function of use at various voltages. Here, bursts of 100 2.0 micro-sec wide pulses at 20 kHz were applied between each measurement. The test was run until an 11% decrease in resistance was observed or 2200 pulses had been applied. The data demonstrates that a significant decrease in resistance can be obtained with the proper selection of a thermal cycle. The data also shows that sufficiently low energies do not result in this change, indicating that unannealed and annealed resistors can be easily measured without altering their resistance.

Accordingly, in this example, the resistors can be programmed or annealed by applying a short burst of pulses at a properly designed energy (e.g. 1000 pulses at around 31 volts, 2 micro sec pulse widths at 20 kHz). Programming the resistors accordingly can thus result in programmed resistors having approximately 7-12% lower resistance values than resistors that were not programmed. Detection of the programmed state can be accomplished using a comparator to compare programmed resistors to a resistor that has not been programmed. Assuming that the read currents and voltages are substantially lower than the programming currents and voltages, no resistance change will occur in the resistors during read cycles. Additionally, since the resistance change observed in WSiN is permanent and does not substantially disrupt or distort the thin film stack used in the inkjet printhead, this method can provide a valuable way to create a small number of identification bits on the printhead that would not cause disruptions or ruptures in the thin film layers upon programming.

Figure 3:
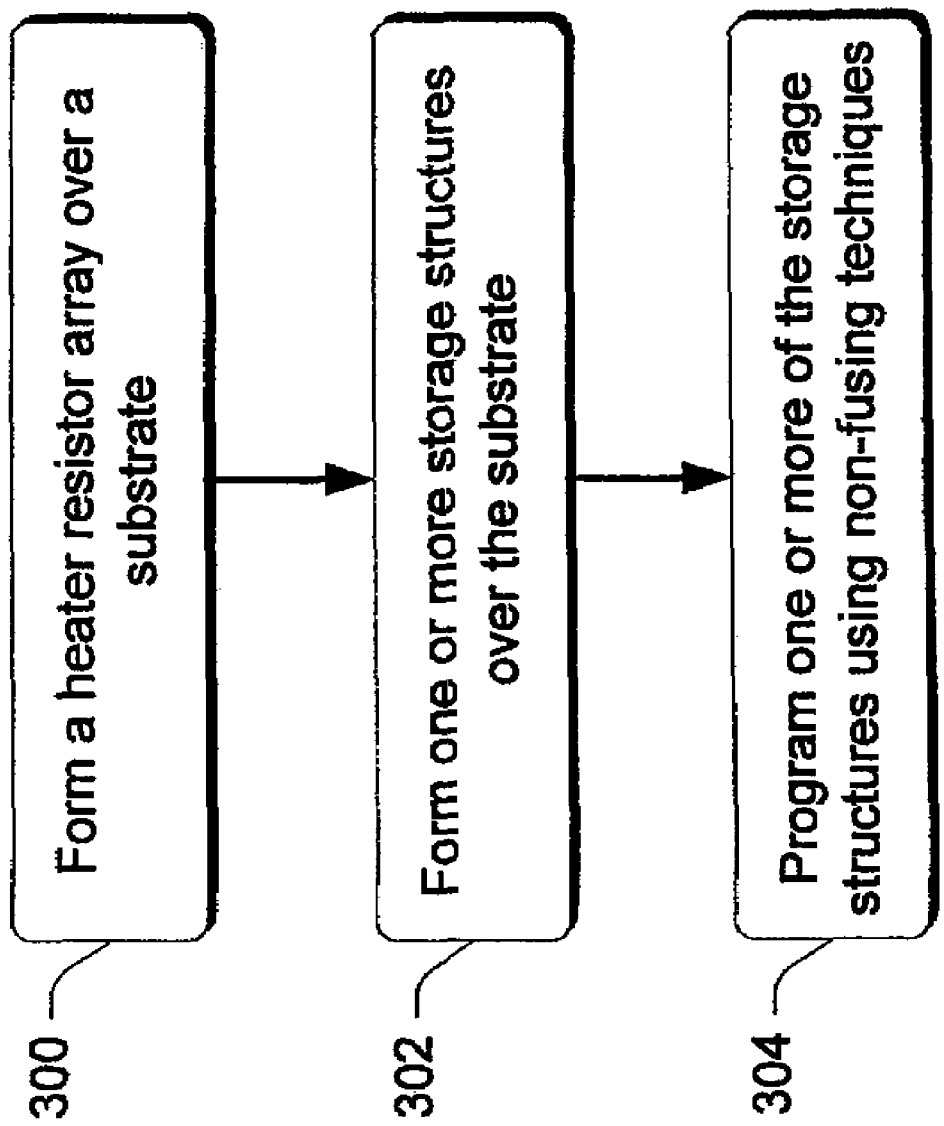
FIG. 3 is a flow diagram that describes steps in a method in accordance with one embodiment.

FIG. 3 is a flow diagram that describes steps in a method in accordance with one embodiment. Step 300 forms a heater resistor array over a substrate. The heater resistor array is a resistor array that is intended for use in a printhead of an inkjet printer. Any suitable formation techniques can be utilized, examples of which are described in some of the patents mentioned above. In addition, any suitable material can be used to form the resistors of the resistor array. Step 302 forms one or more storage structures over the substrate. Any suitable storage structures can be formed. In the illustrated and described embodiment, the storage structures are formed using the same material that is used to form the resistors of the resistor array. Additionally, in the illustrated example, the storage structures are formed contemporaneously with and using at least some of the same process flow that is utilized to form the heater resistors. One example of a suitable process flow is given above.

Advantageously, the material that is selected to form the heater resistors and storage structures has a characteristic that enables it to be processed, on a resistor-by-resistor basis, in a manner that can non-destructibly and non-fusibly change the resistance value of the material. In the illustrated example, this processing comprises annealing selected resistors comprising the storage structures. By annealing selected resistors, the resistance values of the annealed resistors can be changed and thus the resistors can be used to program data onto the substrate as noted above.

Step 304 programs one or more of the storage structures using non-fusing techniques. As noted above, a suitable non-fusing technique comprises annealing one or more of the resistors and not annealing others of the resistors. It is possible that the resistors comprising the storage structures can be programmed in ways other than through the annealing process.

Using Heater Resistors as a Non-Fusible Storage Structure

In accordance with another embodiment, the heater resistors themselves can be used as a non-volatile, non-fusible storage structure. In this example, the resistor material is selected such that it has the characteristics mentioned above. Accordingly, one choice for the resistor material is WSiN. Other suitable materials can, of course, be used.

In this embodiment, the selected resistor material has another characteristic or property that is useful for incorporating it as a storage structure. Specifically, when the material is formed to comprise a heater resistor, adjacent resistors or those resistors in close proximity with one another tend to have similar resistance values. And, although a wafer or die can have a significant variation in resistor values across the wafer or die, those resistors that are adjacent or in close proximity tend to have similar resistance values. This being the case, adjacent or proximate resistors can be processed differently after formation to impart to the resistors characteristics that enable the resistors to collectively encode digital data. Specifically, if one resistor is not annealed, and an adjacent resistor is annealed, then the differential in the resistance values of the individual resistors can be used to encode digital data. Thus, after formation and encoding of digital data, the heater resistor array can be scanned to identify which resistors are not annealed and which resistors are annealed. This information can then be used to access digital data that is encoded on the die or wafer.

Figure 4:
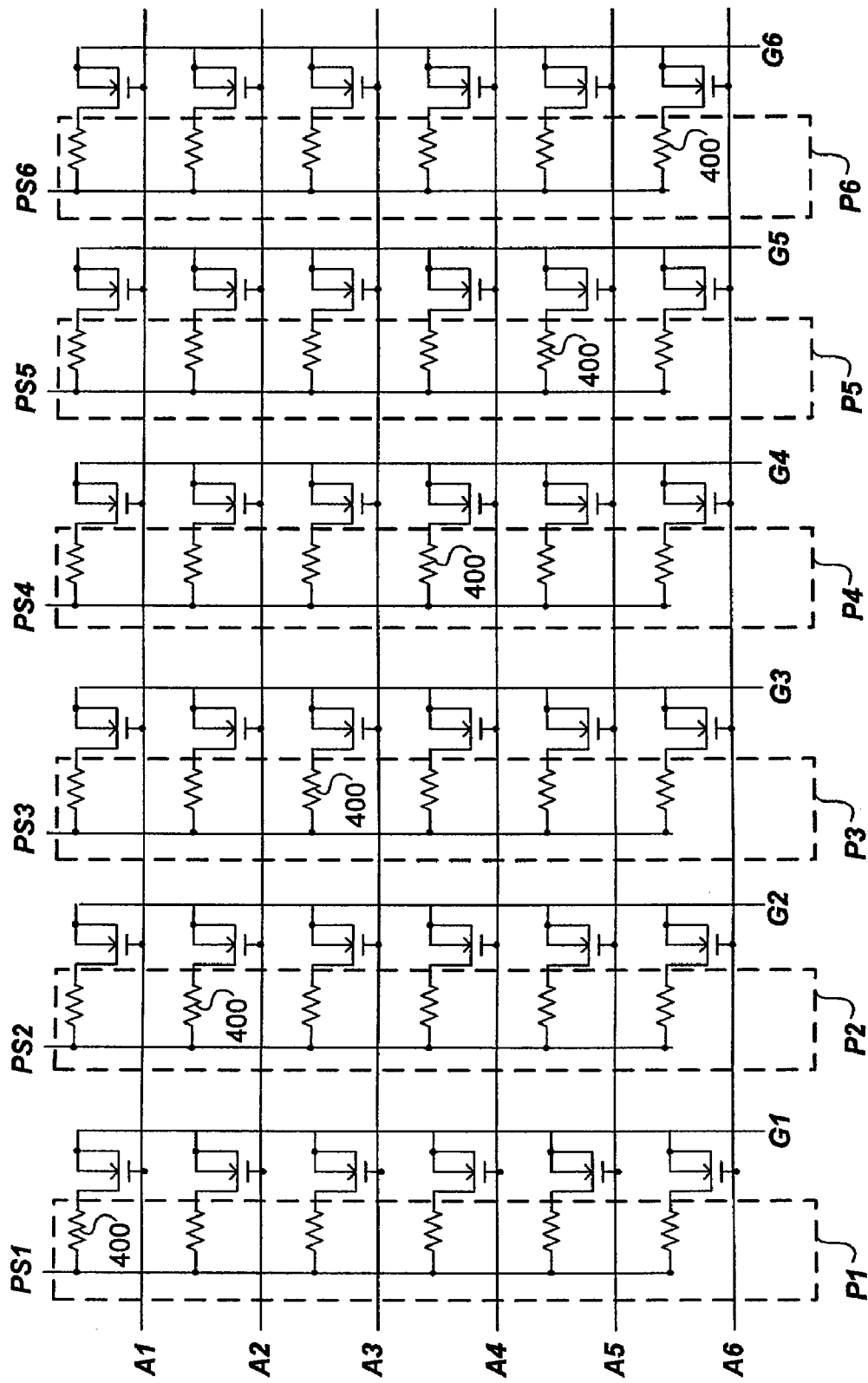
FIG. 4 is a circuit diagram that illustrates an exemplary ink jet printhead heater resistor layout, and is useful in understanding one or more of the described embodiments.

Before describing this embodiment in more detail, consider the following on the structure and layout of heater resistors. In this embodiment, heater resistors are incorporated into a "pen" which forms part of the inkjet printer's print cartridge. The pen is electrically constructed of a series of address inputs that drive FETs in rows of a matrix, and primitive inputs that drive firing resistors in the columns of the matrix. As an example, consider FIG. 4 which shows an exemplary matrix that comprises firing or heater resistors 400. The heater resistors are organized into primitive groups—designated P1-P6. Each primitive group makes up a column of the matrix. Address inputs A1-A6 are connected to the drive transistors of, and connect heater resistors in different primitive groups. As an example, address input A1 is connected to the gates of the drive transistors for the top most heater resistors of primitive groups P1-P6. Ground lines G1-G6 are also depicted.

Individual primitive inputs (PS1-PS6) are commonly connected to the heater resistors of individual respective primitives. As an example, primitive input PS1 is connected with all of the individual heater resistors that make up primitive group P1. Firing a particular heater resistor is performed by applying an address select signal to an address input, and providing an energizing power pulse at its primitive input. So, for example, to fire the top most heater resistor in primitive group P1, address input A1 is selected and a pulse is applied to primitive input PS1. None of the other heater resistors within primitive group P1 are fired as their corresponding address inputs have not been selected at this time. Typically then, the resistors are fired by successively and individually driving the individual address inputs and selectively pulsing the primitive inputs of the heater resistors that are desired to be fired.

Thus, each and every heater resistor is fabricated to be separately and individually addressable. In order to function as heater resistors, the resistors are annealed during the fabrication process at the wafer level before die singulation. By choosing not to anneal selected heater resistors, data can be encoded by virtue of the resistor value differences that are observed between annealed and unannealed resistors.

Typically, heater resistors are annealed at the wafer level through the use of probes that engage wafer pads, address the heater resistors, and then apply appropriate annealing pulses to affect the annealing process. Once annealed, the heater resistors can serve as heater resistors. To selectively encode data at the wafer level, the software code that drives the annealing process can be modified such that individual resistors that are desired to be left in the unannealed state can be skipped during the annealing process.

In but one example, each individual die on a wafer is processed to comprise 2112 heater resistors. These individual die are then singulated and incorporated into individual pen cartridges. By virtue of the fact that there are 2112 heater resistors, in one embodiment, each die has the potential to provide 2112 bits of memory. In other embodiments, a lesser number of bits of memory can be provided. This constitutes greater data storage capacities compared with previously-used on-die fusible links.

The types of information that can be stored on the die can comprise any suitable type of information that is desirable to associate with a particular die. Examples of such information include, without limitation, wafer lot, wafer number, wafer row and column number, Dtsr0 (ambient reading of an on-die digital temperature sense), electrical lockout (to prevent the use of the die in the wrong product), color/black flag (to detect an incorrectly built print cartridge in the factory), resistor anneal flag (so that the resistor is not annealed twice), and the like.

It should be noted that the encoding of the data on the die through the non-fusing techniques can be temporary or permanent. In the event that the data is to be temporarily encoded, the resistor or resistors that are utilized to encode the data can be annealed at some time after they were skipped in the annealing process. Annealing the heater resistors at some later time simply involves suitably addressing the resistor(s) to be annealed and then applying the appropriate energy pulse. Alternately, data can be permanently embodied on the die and hence the print cartridge by simply not annealing the resistors. The implication of this decision, however, is that the resistor will not typically be suitable for use as a heater resistor. If the number of resistors that are used to encode data is relatively small, then the performance impact on the completed pen should be de minimus.

Figure 5:
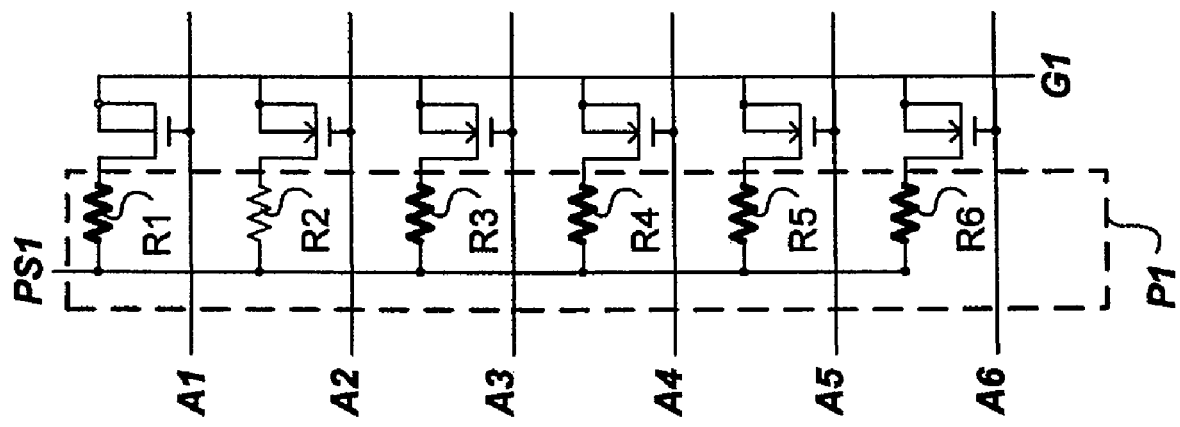
FIG. 5 is an isolated view of an exemplary primitive group and is useful in understanding one or more embodiments.

In accordance with this embodiment, the resistors that are selected for encoding data are selected such that they are physically adjacent or proximate one another. In the FIG. 4 example, resistors that are the physically closest are the resistors that form a common primitive group. As an example, consider FIG. 5 which shows a portion of one primitive group of a heater resistor array. In this example, assume that resistors R1, R3, R4, R5, and R6 have been annealed as usual (as indicated by the boldface representation). Assume also that resistor R2 was skipped during the annealing process (as indicated by the unbolded representation). By way of example, resistors R1 and R2 can comprise a memory cell that is utilized to encode data. Specifically, when the resistor array is scanned, a determination can be made that the resistance values as between resistors R1 and R2 vary in a manner that indicates data has been encoded. In this example and by virtue of the fact that resistor R2 is the only unannealed resistor in the primitive group, a digital value of 101111 might be encoded where each of resistors R1 and R3-R6 correspond to a digital value of 1, and resistor R2 corresponds to a digital value of 0. This can be ascertained by virtue of the following characteristics that annealed versus unannealed resistors share:

Adjacent unannealed resistors on a die have very similar resistance values, even though there can be a significant variation across the entire die;

Adjacent annealed resistors on a die have very similar resistance values; and

Adjacent unannealed-annealed resistors have very dissimilar resistance values.

Thus, for example, when the die is scanned, a determination can be made that the resistance values of R1 and R2 are sufficiently different as to indicate data has been encoded. Further, the resistance values of resistor pairs R3/R4, R4/R5, and R5/R6 are sufficiently similar as to indicate that each resistor of the resistor pair has been annealed. Accordingly, since only one of the resistors has not been annealed, the digital value 101111 has been encoded. Of course, this represents but one encoding scheme only. It is to be appreciated that a wide variety of encoding schemes can be utilized.

For example, an encoding scheme that encodes one bit per print head can be utilized. This would constitute a very easy implementation, although it represents the least efficient use of the heater resistors. An example of the information that might be encoded using this scheme is the wafer row/column number. Alternately, multiple bits can be encoded per printhead. This approach improves resistor utilization and provides the basis for a wide variety of encoding approaches. For example, when encoding multiple bits per printhead, various combinations of resistors can be utilized such as resistor strings (i.e. resistors that are serially disposed) and the like.

As an example, consider the following in connection with FIG. 6. There, a look up table 600 is provided and is used to map encoded resistors to an encoded value that is associated with the information that is encoded on the die. Table 600 has a first column 602 that is associated with the resistors that have been used to encode the data and a second column 604 that is mapped to the combination of resistors that have been encoded. The second column can be used to contain any data that might be desirable to associate with the die. For example, if resistors R1, R20, R98, R500, and R704 are unannealed, such unannealed resistors might map to a particular wafer lot number.

It is to be appreciated and understood that a wide variety of mappings and mapping heuristics might be employed to digitally encode data on the die using the heater resistors, other than the mechanism(s) described. One embodiment describes a mechanism by which data can be easily and non-destructively encoded on a print head die using heater resistors that are configured to be used as an ink ejecting mechanism.

FIG. 7 is a flow diagram that describes steps in a method in accordance with one embodiment. Step 700 forms a heater resistor array over a substrate. This step can be accomplished using any suitable technique and using any suitable material. Examples of techniques that can be utilized to form suitable resistor arrays are described in some of the patents referenced above. An exemplary material that can be used is described above and comprises WSiN. It is to be appreciated that other materials can be employed. Characteristics of suitable materials that can be employed are described above. After the resistors of the heater array have been formed, step 702 anneals multiple resistors of the resistor array. Step 704 encodes data on the substrate by leaving at least one resistor of the resistor array unannealed. Steps 702, 704 can be accomplished contemporaneously during the annealing process. Those resistors of the resistor array that are desired to be left unannealed can simply be skipped during the annealing process. This can be accomplished via a programmatic change that is made to the annealing tool that accomplishes the annealing.

Once the data is encoded, the die or wafer can later be scanned to reveal the encoded data. The encoded data (i.e. the resistors that have not been annealed) can be used, in some embodiments, as an index into a table that associates useful information with the resistors that are encoded. But one example of how this can be done is given above.

Thus, in this example, selected ink jet heater resistors can be multifunctional. A first function of the resistor can be to encode data as described. A second function of the same resistor can be to function as a heater resistor to eject ink onto a print medium. To impart heater resistor functionality to a resistor that was previously employed as a data storage structure, the resistor should be suitably annealed. As noted above, this can be done at the pen level if so desired. Accordingly, the heater resistor array is configurable in a manner that imparts to it PROM-like functionality.

In this embodiment PROM-like memory can be provided on the ink jet die without any meaningful cost. The heater resistors are already present on the die; some of them are simply being used as storage structures. Additionally, information can be retained on the die without power applied to the die to, for example, refresh the memory. Thus, the memory is non-volatile. Further, a relatively large number of bits can be provided on the die, depending on the particular implementation. In one implementation, more than 1000 bits can be supplied per die. In another embodiment, there is no fusing-induced, thin film damage to the substrate which reduces the likelihood of an ink-induced failure.

CONCLUSION

Various embodiments provide methods and resultant structures that employ on-die, non-volatile, non-fusable storage structures on ink jet printhead die. The embodiments can utilize heater resistor material for the storage structures to provide PROM-like storage capabilities. Because the resistor material is used to store data in a manner which does not require it to be subjected to fuse-blowing processes, many issues associated with the fusing-blowing processes are mitigated.

Although the disclosure has been described in language specific to structural features and/or methodological steps, it is to be understood that the appended claims are not limited to the specific features or steps described. Rather, the specific features and steps are exemplary forms of implementing this disclosure.

The invention claimed is:

1. A method for fabricating a printhead, the method comprising:

forming on a substrate multiple resistors, some of the resistors to be used as heater resistors configured to eject fluid and some of the resistors to be used as storage resistors that store data;

annealing the heater resistors; and intentionally not annealing at least one of the storage resistors;

wherein the annealed storage resistors have a first state representing a first digital value and the unannealed storage resistors have a second state representing a second digital value, such that the values associated with the storage resistors can be read by an appropriate detection circuit.

2. The method of claim 1, wherein the act of forming comprises forming the resistors from a material comprising a metal silicon nitride material.

3. The method of claim 1, wherein the act of forming comprises forming the resistors from a Cermet resistor material.

4. The method of claim 1, wherein the act of forming comprises forming the resistors from a material comprising WSiN.

5. The method of claim 1, wherein the act of forming comprises forming the resistors from a material whose resistance is a function of whether or not the material has been annealed.

6. The method of claim 1, wherein the act of forming the resistors comprises forming a single resistor array that includes both the heater resistors and the storage resistors.

7. The method of claim 1, wherein the act of forming the resistors comprises forming an array of heater resistors and forming a separate array of storage resistors that does not comprise part of the heater resistor array.

8. The method of claim 1, wherein the first and second states pertain to first and second levels of resistance of the storage resistors.

9. The method claim 1, wherein annealing comprises applying a short burst of pulses to the resistors during a programming action.

* * * * *